(12) United States Patent
Aramaki et al.

(10) Patent No.: US 9,536,804 B2
(45) Date of Patent: Jan. 3, 2017

(54) METHOD OF MANUFACTURING HEAT CONDUCTIVE SHEET

(71) Applicant: Dexerials Corporation, Shinagawa-ku, Tokyo (JP)

(72) Inventors: Keisuke Aramaki, Utsunomiya (JP); Atsuya Yoshinari, Kanuma (JP); Takuhiro Ishii, Tachikawa (JP); Shinichi Uchida, Utsunomiya (JP); Masahiko Ito, Nikko (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 0 days.

(21) Appl. No.: 14/899,221

(22) PCT Filed: Jun. 27, 2014

(86) PCT No.: PCT/JP2014/067152
§ 371 (c)(1),
(2) Date: Dec. 17, 2015

(87) PCT Pub. No.: WO2015/002085
PCT Pub. Date: Jan. 8, 2015

(65) Prior Publication Data
US 2016/0141223 A1    May 19, 2016

(30) Foreign Application Priority Data

Jul. 1, 2013 (JP) .................................. 2013-138461
Jun. 16, 2014 (JP) .................................. 2014-123047

(51) Int. Cl.
*F28F 13/18*   (2006.01)
*H01L 23/373*   (2006.01)
(Continued)

(52) U.S. Cl.
CPC ........... *H01L 23/3737* (2013.01); *F28F 21/02* (2013.01); *H01L 21/4871* (2013.01);
(Continued)

(58) Field of Classification Search
CPC .............. H05K 7/20481; H05K 7/2049; H01L 21/4871; H01L 23/433; B32B 7/12; B32B 25/08; B32B 27/283; B32B 37/10; B32B 38/0004
(Continued)

(56) References Cited

U.S. PATENT DOCUMENTS 6,517,744 B1 *   2/2003   Hara ..................... B29C 70/025
                                                        148/108
6,794,030 B1 *   9/2004   Okada ................. H01L 23/3737
                                                        257/E23.107
(Continued)

FOREIGN PATENT DOCUMENTS

JP   2007-084649 A   4/2007
JP   2008-211021 A   9/2008
(Continued)

OTHER PUBLICATIONS

Sep. 16, 2014, International Search Report issued in International Patent Application No. PCT/JP2014/067152.
(Continued)

*Primary Examiner* — Davis Hwu
(74) *Attorney, Agent, or Firm* — KENJA IP LAW PC

(57) ABSTRACT

Provided is a method of manufacturing a heat conductive sheet that itself is imparted with stickiness and has reduced heat resistance due to improved adhesion to a heat generator and a heat dissipater and that may be fixed provisionally without the need for using an adhesive agent or the like. The method includes the steps of molding a heat conductive resin composition, which includes heat conductive fillers and a
(Continued)

binder resin, into a predetermined shape and curing the heat conductive resin composition to obtain a molded product of the heat conductive resin composition, cutting the molded product into sheets to obtain a molded product sheet, and coating an entire surface of a sheet main body (7) with an uncured component (8) of the binder resin oozing from the sheet main body (7).

8 Claims, 6 Drawing Sheets

(51) Int. Cl.
    *F28F 21/02*     (2006.01)
    *H01L 21/48*     (2006.01)
    *H01L 23/367*     (2006.01)

(52) U.S. Cl.
    CPC   *H01L 23/3675* (2013.01); *H01L 2224/16225* (2013.01); *H01L 2224/73253* (2013.01); *H01L 2924/0002* (2013.01); *H01L 2924/16152* (2013.01)

(58) Field of Classification Search
    USPC .......................................................... 165/133
    See application file for complete search history.

(56) References Cited

U.S. PATENT DOCUMENTS

| | | | |
|---|---|---|---|
| 2003/0207128 A1* | 11/2003 | Uchiya | H01L 23/3737 428/447 |
| 2007/0054971 A1* | 3/2007 | Hiroshige | C08J 9/0066 521/60 |
| 2016/0150680 A1* | 5/2016 | Aramaki | H01L 23/3737 165/133 |

FOREIGN PATENT DOCUMENTS

| | | |
|---|---|---|
| JP | 2009010296 A | 1/2009 |
| JP | 2009-215404 A | 9/2009 |
| JP | 2010-114421 A | 5/2010 |
| JP | 2012-001638 A | 1/2012 |
| JP | 2012-023335 A | 2/2012 |
| KR | 1020110089102 A | 8/2011 |

OTHER PUBLICATIONS

Feb. 1, 2016, Office Action issued by the Korean Intellectual Property Office in the corresponding Korean Patent Application No. 10-2015-7035980.

Jun. 29, 2016, Office Action issued by the Korean Intellectual Property Office in the corresponding Korean Patent Application No. 10-2015-7035980.

* cited by examiner

METHOD OF MANUFACTURING HEAT CONDUCTIVE SHEET

TECHNICAL FIELD

The present disclosure relates to a method of manufacturing a heat conductive sheet disposed between an electronic element, such as a semiconductor device, and a heat dissipation member. The present disclosure also relates to such a heat conductive sheet and a heat dissipation member including the heat conductive sheet.

This application claims priority to and the benefit of Japanese Patent Application No. 2013-138461 filed on Jul. 1, 2013 and Japanese Patent Application No. 2014-123047 filed on Jun. 16, 2014, the entire contents of which are incorporated herein by reference.

BACKGROUND

Since semiconductor devices used in various electronic devices, such as a personal computer, and other devices generate heat when driven and the generated heat might build up to adversely affect actuation of the semiconductor devices and peripheral devices, various cooling methods are conventionally adopted. Examples of the cooling methods adopted in electronic elements, such as a semiconductor device, include a method of cooling air in a housing of the device by using a fan attached to the device, and a method of attaching a heat sink, such as a heat dissipation fin and a heat dissipation plate, to the semiconductor device to be cooled.

When a heat sink is attached to the semiconductor device for cooling, a heat conductive sheet is disposed between the semiconductor device and the heat sink to facilitate efficient dissipation of heat from the semiconductor device. As the heat conductive sheet, the one in which fillers, such as heat conductive fillers including, for example, carbon fibers, are dispersed in a silicone resin. (Refer to Patent Literature 1.)

These heat conductive fillers have anisotropy of heat conduction. For example, when used as the heat conductive fillers, carbon fibers are known to exhibit a heat conductivity of about 600 W/m·K to 1200 W/m·K in a fiber direction, and boron nitride is also known to exhibit a heat conductivity of about 110 W/m·K in a surface direction and a heat conductivity of about 2 W/m·K in a direction perpendicular to the surface direction, thus having the anisotropy.

CITATION LIST

Patent Literature

PTL 1: Japanese Patent Application Publication No. 2012-23335

SUMMARY

Technical Problem

Here, the amount of heat dissipated by electronic elements, such as a CPU used in a personal computer, is increasing more than ever each year due to the increased speed and enhanced performance. In contrast, however, chip sizes of processors or the like are almost the same as or smaller than before due to development in a micro silicon circuit technology, and heat flux per unit area is increasing. Accordingly, to prevent troubles caused by the temperature rise or the like, there is a demand for a more effective way of dissipating heat from and cooling electronic elements, such as a CPU.

An increase in heat dissipation characteristics of a heat conductive sheet requires a decrease in heat resistance, which is an index indicating difficulty of heat conduction. To decrease heat resistance, it is effective to improve adhesion of the heat conductive sheet to an electronic element as a heat generator or to a heat sink or the like as a heat dissipater.

However, when the heat conductive fillers, such as carbon fibers, are exposed to a surface of the sheet, the conformity and adhesion to the heat generator and the heat dissipater are deteriorated, and heat resistance cannot be reduced satisfactorily. Although another method proposed is to sandwich the heat conductive sheet between the heat generator and the heat dissipater by using high load to sink the heat conductive fillers in the sheet, this method is not suitable when used for the heat generator requiring low load because, in this case, the heat conductive fillers do not sink, and heat resistance cannot be reduced.

Furthermore, the heat conductive fillers, such as carbon fibers, exposed to the surface of the sheet decrease weak stickiness (tackiness) of the surface of the sheet, and this inhibits provisional fixing to the heat generator and the heat dissipater. This poses the need for using an additional adhesive sheet or adhesive agent for provisional fixing at the time of mounting the heat conductive sheet between the heat generator and the heat dissipater. However, the use of such an adhesive sheet or adhesive agent complicates the mounting process.

In view of the above, the present disclosure is to provide a method of manufacturing a heat conductive sheet that itself is imparted with stickiness and therefore has improved adhesion to the heat generator and the heat dissipater and provides excellent heat conductivity and that may be fixed provisionally without the need for using an adhesive agent or the like and provides excellent mountability. The present disclosure is also to provide such a heat conductive sheet and a heat dissipation member including the heat conductive sheet.

Solution to Problem

One of aspects of the present disclosure for solving the above problem resides in a method of manufacturing a heat conductive sheet, including the steps of: molding a heat conductive resin composition, which includes heat conductive fillers and a binder resin, into a predetermined shape and curing the heat conductive resin composition to obtain a molded product of the heat conductive resin composition; cutting the molded product into sheets to obtain at least one molded product sheet; and coating an entire surface of the sheet main body with an uncured component of the binder resin oozing from the sheet main body.

Another aspect of the present disclosure resides in a heat conductive sheet, including: a sheet main body made of a cured heat conductive resin composition, which includes heat conductive fillers and a binder resin, wherein a surface of the sheet main body is coated with an uncured component of the binder resin.

Yet another aspect of the present disclosure resides in a heat dissipation member, including: a heat spreader configured to dissipate heat generated by an electronic element; and a heat conductive sheet disposed on the heat spreader and sandwiched between the heat spreader and the electronic element, wherein the heat conductive sheet includes a sheet main body made of a cured heat conductive resin composition, which includes heat conductive fillers and a binder resin, and an entire surface of the sheet main body is coated with an uncured component of the binder resin oozing from the sheet main body as a result of standing for a predetermined time period or longer.

Advantageous Effect

According to the present disclosure, the surface of the sheet main body is coated with the uncured component of the binder resin, and the fillers exposed to the surface are also coated with the uncured component. Consequently, the surface of the sheet main body is imparted with weak stickiness (tackiness), resulting in improvement in conformity and adhesion to the heat generator, the heat dissipater, or the like to which the sheet is to be adhered, and this in turn results in a reduction in heat resistance.

Furthermore, with the surface of the sheet main body coated with the uncured component of the binder resin and imparted with weak stickiness, the present disclosure allows provisional fixing of the heat conductive sheet to the heat generator, the heat dissipater, or the like to which the sheet is to be adhered. Accordingly, the present disclosure is able to omit the need for using an additional adhesive agent and accordingly, simplify manufacturing processes and reduce cost.

DETAILED DESCRIPTION

Preferred embodiments of a method of manufacturing a heat conductive sheet, a heat conductive sheet, and a heat dissipation member to which the present disclosure is applied will be described in detail below with reference to the drawings. Needless to say, the present disclosure is not limited to the following embodiments, and various changes may be made without departing from the gist of the present invention. The drawings are merely schematically illustrated and proportions of dimensions and so forth may be different from actual ones. Specific dimensions and the like are to be determined in consideration of the description below. Furthermore, different drawings naturally include portions with different dimensional relations and ratios.

Figure 1:
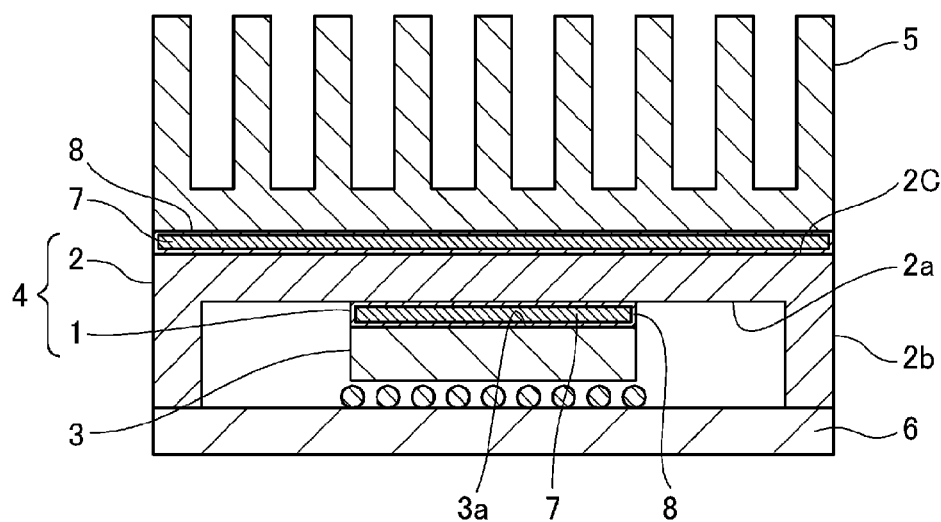
FIG. 1 is a sectional view illustrating a heat conductive sheet and a heat dissipation member to which the present disclosure is applied.

A heat conductive sheet 1 to which the present disclosure is applied dissipates heat generated by an electronic element 3, such as a semiconductor device. As illustrated in FIG. 1, the heat conductive sheet 1 is fixed to a main surface 2a of a heat spreader 2 that opposes to the electronic element 3 to be sandwiched between the electronic element 3 and the heat spreader 2. The heat conductive sheet 1 is also sandwiched between the heat spreader 2 and the heat sink 5. The heat conductive sheet 1, together with the heat spreader 2, constitutes a heat dissipation member 4 that dissipates heat of the electronic element 3.

The heat spreader 2 is formed in, for example, a square plate shape and includes the main surface 2a opposing to the electronic element 3 and a side wall 2b extending from an outer circumference of the main surface 2a. The heat conductive sheet 1 is disposed on the main surface 2a of the heat spreader 2 that is surrounded by the side wall 2b, and the heat sink 5 is disposed on another surface 2c of the heat spreader 2 that opposes to the main surface 2a via the heat conductive sheet 1. The heat spreader 2 with higher heat conductivity has lower heat resistance and absorbs heat of the electronic element 4, such as a semiconductor device, more effectively. Accordingly, copper and aluminum, which have excellent heat conductivity, may be used to form the heat spreader 2.

The electronic element 3 is, for example, a semiconductor package, such as a BGA, and mounted on a circuit board 6. An end surface of the side wall 2b of the heat spreader 2 is also mounted on the circuit board 6 and thus, the side wall 2b surrounds the electronic element 3 with a predetermined distance defined therebetween.

The heat conductive sheet 1 is adhered to the main surface 2a of the heat spreader 2 to form the heat dissipation member 4 that absorbs heat generated by the semiconductor device 4 and dissipates the heat through the heat sink 5. The heat conductive sheet 1 may be adhered to the heat spreader 2 by using adhesive strength of the heat conductive sheet 1 itself which is described later or by using an adhesive agent as needed. As the adhesive agent, a known heat dissipation resin or heat dissipation adhesive film that serves to adhere the heat conductive sheet 1 to the heat spreader 2 and to conduct heat may be used.

[Heat Conductive Sheet 1]

The heat conductive sheet 1 includes a sheet main body 7 made of a cured heat conductive resin composition, which includes heat conductive fillers and a binder resin, and the entire surface of the sheet main body 7 is coated with an uncured component 8 of the binder resin oozing from the sheet main body.

The heat conductive sheet 1 may be manufactured by curing the heat conductive resin composition, which includes the heat conductive fillers and the binder resin, to obtain a resin molded product, cutting the obtained resin molded product into sheets to obtain a molded product sheet, and subsequently leaving the obtained molded product sheet standing for a predetermined time period to coat the sheet main body 7 with the uncured component 8 of the binder resin. A description is given later in detail.

The heat conductive fillers included in the heat conductive sheet 1 serve to conduct heat from the electronic element 3 to the heat spreader 2 efficiently, and fibrous fillers may be preferably used. The fibrous fillers with an excessively small average diameter have an excessively large specific surface area, which in turn might lead to an excessively high viscosity of the resin composition in forming the heat conductive sheet 1, whereas those with an excessively large average diameter might pose difficulty in manufacturing the molded product. Accordingly, the average diameter of the fibrous fillers may be preferably in the range of 5 to 12 μm. The fibrous fillers may also have an average fiber length preferably in the range of 30 to 300 μm. An average fiber length of less than 30 μm tends to lead to an excessively large specific surface area and an excessively high viscosity of the heat conductive resin composition, and an average fiber length of more than 300 μm tends to hinder compression of the heat conductive sheet 1.

Detailed examples of the fibrous fillers preferably include, for example, carbon fibers, metal fibers (such as fibers of nickel and iron), glass fibers, and ceramic fibers (such as nonmetallic inorganic fibers, e.g., fibers of oxides such as aluminum oxide and silicon dioxide; nitrides such as boron nitride and aluminum nitride; borides such as aluminum boride; and carbides such as silicon carbide).

The fibrous fillers are selected according to the properties, such as mechanical properties, thermal properties, and electric properties, required for the heat conductive sheet 1. Especially, pitch-based carbon fibers or graphitized carbon fibers of polybenzazole may be preferably used due to their high elastic modulus, favorable heat conductivity, high electric conductivity, radio shielding properties, low thermal expansion, etc.

When the content of the fibrous fillers in the heat conductive sheet 1 is too small, the heat conductivity tends to become low, and when the content is too high, the viscosity tends to become high. Accordingly, the content of the fibrous fillers in the heat conductive sheet 1 is preferably in the range of 16 to 40 vol %.

In addition to the fibrous fillers, plate-like fillers, scale-like fillers, spherical fillers, or the like may also be used to an extent that does not impair the advantageous effect of the present disclosure. Especially, from the viewpoint of suppressing secondary aggregation of the fibrous fillers in the heat conductive resin composition, spherical fillers (preferably, spherical alumina or spherical aluminum nitride) having a diameter of 0.1 to 10 μm may be used in the amount of preferably 50 to 900 parts by mass based on 100 parts by mass of the fibrous fillers.

The binder resin is used to hold the fibrous fillers in the heat conductive sheet 1 and is selected according to the properties, such as mechanical strength, heat resistance, and electric properties, required for the heat conductive sheet 1. Such a binder resin may be selected from a thermoplastic resin, a thermoplastic elastomer, and a thermosetting resin.

Examples of the thermoplastic resin include: polyethylene, polypropylene, ethylene-α olefin copolymers such as ethylene-propylene copolymers, polymethylpentene, polyvinyl chloride, polyvinylidene chloride, polyvinyl acetate, ethylene-vinyl acetate copolymers, polyvinyl alcohol, polyvinyl acetal, fluorine-based polymers such as polyvinylidene fluoride and polytetrafluoroethylene, polyethylene terephthalate, polybutylene terephthalate, polyethylene naphthalate, polystyrene, polyacrylonitrile, styrene-acrylonitrile copolymers, an acrylonitrile-butadiene-styrene copolymer (ABS) resin, a polyphenylene-ether copolymer (PPE) resin, a denatured PPE resin, aliphatic polyamides, aromatic polyamides, polyimide, polyamide-imide, polymethacrylic acid, polymethacrylates such as polymethyl methacrylate ester, polyacrylic acids, polycarbonate, polyphenylene sulfide, polysulfone, polyethersulfone, polyethernitrile, polyether ketone, polyketone, liquid crystal polymers, a silicone resin, and ionomers.

Examples of the thermoplastic elastomers include styrene-butadiene block copolymers and hydrogenated products thereof, styrene-isoprene block copolymers and hydrogenated products thereof, styrene-based thermoplastic elastomers, olefin-based thermoplastic elastomers, vinyl chloride-based thermoplastic elastomers, polyester-based thermoplastic elastomers, polyurethane-based thermoplastic elastomers, and polyamide-based thermoplastic elastomers.

Examples of the thermosetting resin include cross-linked rubber, an epoxy resin, a phenolic resin, a polyimide resin, an unsaturated polyester resin, and a diallyl phthalate resin. Detailed examples of the cross-linked rubber include natural rubber, acrylic rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluoro rubber, urethane rubber, and silicone rubber.

The heat conductive resin composition may be prepared by uniformly mixing the fibrous fillers and the binder resin, and as needed, various additives and a volatile solvent, by using a known method.

In the heat conductive sheet 1, as described later, the uncured component 8 of the binder resin oozes from the entire surface of the sheet main body 7 by leaving standing for a predetermined time period or longer after the cutting into sheets, and the surface of the sheet main body 7 is coated with the uncured component 8. Accordingly, the fibrous fillers included in the heat conductive sheet 1 and exposed to the slice surface are coated with the uncured component of the binder resin, and the surface is imparted with weak stickiness (tackiness). Thus, the heat conductive sheet 1 has improved conformity and adhesion to surfaces of the electronic element 3 and the heat spreader 2, which in turn results in a reduction in heat resistance.

Furthermore, the surface of the sheet main body 7 coated with the uncured component 8 of the binder resin and imparted with weak stickiness allows adhesion of the heat conductive sheet 1 to the main surface 2a of the heat spreader 2 or provisional fixing of the heat conductive sheet 1 to an upper surface 3a of the electronic element 3. Thus, the heat conductive sheet 1 may omit the need for using an additional adhesive agent and accordingly, simplify manufacturing processes and reduce cost.

Herein, the heat conductive sheet 1 may achieve a desired weak stickiness (tackiness) by regulating a compounding ratio of a main ingredient and a curing agent of the binder resin which are included in the heat conductive resin composition. For example, when a two-part liquid silicone resin of addition reaction type is used as the binder resin included in the heat conductive resin composition, the compounding ratio of the main ingredient and the curing agent is preferably set as follows:

Main ingredient:curing agent=50:50 to 65:35.

Regulating the compounding ratio in the above range allows the uncured component 8 of the binder resin to ooze out and coat the entire surface of the sheet main body 7 by the standing for a predetermined time period while the sheet shape is maintained, and the entire heat conductive sheet 1 achieves an appropriate weak stickiness.

On the other hand, when the ratio of the main ingredient is less than the above compounding ratio, the heat conductive sheet 1 will be not flexible enough due to excessive curing of the binder resin, and moreover, the sheet main body 7 at least in part will not be imparted with even weak stickiness because the sheet main body 7 is not coated sufficiently with the uncured component 8 of the binder resin. When the ratio of the curing agent is less than the above compounding ratio, excessive stickiness will be imparted, leading to difficulty in maintaining the sheet shape, and operability will be deteriorated due to difficulty in cutting the molded product into sheets.

[Lightness L* in L*a*b Color System]

Object colors generally have three parameters of lightness (luminosity), hue (tone), and chroma (saturation). Precise color measurement and representation require a color system for numerically expressing the three parameters objectively. The L*a*b color system is an example of the color system. The L*a*b color system measurement may be conducted easily by using a measurement device, such as a commercial spectral colorimeter.

The L*a*b color system is a color system specified in, for example, JIS Z 8729 and JIS Z 8730, and representing colors transformed into a spherical color space. In the L*a*b color system, lightness is represented along a vertical axis (z-axis), hue is represented along a direction extending toward an outer circumference, and chroma is represented by a distance from a center axis.

The parameter L* represents a position on the vertical axis (z-axis) expressing lightness. The value of lightness L* is positive, and the smaller value indicates the lower lightness, that is to say, the darker color. In detail, the value of L* varies from 0, which corresponds to black, to 100, which corresponds to white.

Furthermore, in a section of the spherical color space taken horizontally at a position of L*=50, a positive direction of an x-axis represents increasing redness, a positive direction of a y-axis represents increasing yellowness, a negative direction of the x-axis represents increasing greenness, and a negative direction of the y-axis represents increasing blueness. The parameter a* represents a position on the x-axis and ranges from −60 to +60. The parameter a* represents a position on the y-axis and ranges from −60 to +60. In this way, the parameters a* and b* are positive or negative numbers representing chromaticity, and as the values are closer to 0 (zero), the colors become closer to black. Hue and chroma are represented by the values of a* and b*.

In the L*a*b color system, the larger lightness L* means increasing whiteness, and the smaller lightness L* means increasing blackness. Furthermore, in the L*a*b color system, the value of a* of less than −1 means increasing greenness, and the value of a* of −1 or more means increasing redness. Moreover, the value of b* of less than −1 means increasing blueness, and the value of b* of more than +1 means increasing yellowness.

The heat conductive sheet 1 includes the curable resin composition, the fibrous fillers, and heat conductive particles. As the volume % of the fibrous fillers is increased, the lightness L* of the surface of the heat conductive sheet 1 is decreased, and as the volume % of the heat conductive particles is increased, the lightness L* is increased. For example, suppose that the surface of a heat conductive sheet, in which the fibrous fillers are carbon fibers, and the heat conductive particles are particles of one or more of alumina, aluminum nitride, and aluminum hydroxide, including at least alumina, is observed. When the area of the carbon fibers is large and when a little white alumina or aluminum nitride is exposed to the surface, the lightness L* tends to be small, and when the area of the carbon fibers is small and when a lot of white alumina or aluminum nitride is exposed to the surface, the lightness L* tends to be large.

To achieve a heat conductive sheet having high heat conductivity, it is not sufficient simply to increase the content of the highly heat conductive fibrous fillers, and the heat conductive particles need to be added to maintain the shape of the heat conductive sheet. Furthermore, to reduce viscosity of the heat conductive resin composition at the time of extrusion, the compounding ratio of the fibrous fillers and the heat conductive particles need to be regulated.

The present inventors have discovered that setting the value of the lightness L* within a predetermined range allows achievement of favorable heat conductivity. That is to say, the heat conductive sheet 1 according to the present embodiment includes the curable resin composition, the fibrous fillers, and the heat conductive particles, and the L* value of the surface of the heat conductive sheet according to the L*a*b color system is in the range between 25 and 70. This helps achieve favorable heat conductivity in a thickness direction of the heat conductive sheet 1. Even when the surface of the sheet has a spotted or a striped pattern, there is no problem if only the L* value falls within the above range. When the surface of the sheet has a spotted or a striped pattern, the fibrous fillers are not orientated to a certain direction but orientated randomly in the thickness direction. The random orientation increases entanglement of the fibrous fillers and points of contact between heat conductive particles, and heat conductivity becomes higher than when the fibrous fillers are orientated to a certain direction. During the process of extruding the heat conductive resin composition into a hollow die, the heat conductive resin composition is extruded through a slit and closely contact within the hollow die. In this process, light and dark irregularities appear on the surface. The L* value of the surface of the heat conductive sheet 1 according to the L*a*b color system may be regulated by adjusting mixing time and stirring rate. As the mixing time is increased and as the stirring rate is increased, the fibrous fillers become small, and the L* value is reduced. On the other hand, as the mixing time is reduced and as the stirring rate is reduced, the fibrous fillers do not become small, and the L* value is increased. Furthermore, when the surface of the sheet is glossy, the L* value tends to be increased. Glossiness of the surface of the sheet may be adjusted by mixing oil and varying an A/B ratio of silicone.

[Manufacturing Processes of Heat Conductive Sheet]

The heat conductive sheet 1 of the present disclosure may be manufactured by a manufacturing method including the following processes (A) to (C). Each of these processes are described in detail below.

<Process A>

First, the fibrous fillers are dispersed in the binder resin to prepare a heat conductive resin composition to be used for manufacturing the heat conductive sheet 1. The preparation may be conducted by uniformly mixing the fibrous fillers and the binder resin, and as needed, various additives and a volatile solvent, by using any known mixing method.

<Process B>

Next, a block of a molded product is formed from the prepared heat conductive resin composition by an extrusion molding method or a metal molding method.

No particular limitation is imposed on the extrusion molding method and metal molding method to be used, and an appropriate method may be selected from various known extrusion molding methods and metal molding methods according to the viscosity of the heat conductive resin composition, the properties required for the heat conductive sheet 1, and so forth.

When the heat conductive resin composition is extruded from a die used in the extrusion molding method or when the heat conductive resin composition is injected into a mold used in the metal molding method, the binder resin flows, and some portions of the fibrous fillers are orientated in the direction of the flow, but the majority of the fibrous fillers are orientated randomly.

When a slit is attached to a tip of the die, the fibrous fillers are more likely to be orientated in a middle portion of the extruded block of the molded product with respect to a widthwise direction thereof. On the other hand, the fibrous fillers are more likely to be orientated randomly in a peripheral portion of the block of the molded product with respect to the widthwise direction thereof under the influence of a wall of the slit.

The size and shape of the block of the molded product may be determined according to the required size of the heat conductive sheet 1. For example, the block of the molded product may be a cuboid having a cross section with a vertical dimension of 0.5 to 15 cm and a horizontal dimension of 0.5 to 15 cm. The length of the cuboid may be determined as needed.

<Process C>

Next, the formed block of the molded product is sliced into sheets. Thus, a molded product sheet, from which the sheet main body 7 is to be formed, is obtained. The fibrous fillers are exposed to the surface (the slice surface) of the sheet resulting from the slicing. No particular limitation is imposed on the slicing method, and an appropriate machine may be selected from known slicing machines (preferably, an ultrasonic cutter or a plane) according to the size and mechanical strength of the block of the molded product. When an extrusion molding method is used as the molding method, some fibrous fillers are orientated in the direction of extrusion. Accordingly, the direction in which the block of the molded product is to be sliced is preferably from 60 to 120 degrees and more preferably from 70 to 100 degrees with respect to the direction of extrusion. The direction is most preferably 90 degrees (orthogonal to the direction of extrusion).

No particular limitation is imposed on the slice thickness, and any appropriate slice thickness may be selected according to, for example, the intended purpose of the heat conductive sheet 1.

<Process D>

Subsequently, the obtained molded product sheet is left standing for a predetermined time period. The standing is conducted in a state where a release film, such as a PET film, is applied to both surfaces of the molded product sheet. However, the molded product sheet does not necessarily need to be supported by the release film or the like. The standing may also be conducted under a normal temperature and pressure.

As a result, from the molded product sheet, the heat conductive sheet 1, in which the uncured component 8 of the binder resin oozes from the sheet main body 7 to coat the entire surface of the sheet main body 7, is obtained. In the heat conductive sheet 1, the fibrous fillers exposed to the slice surface are coated with the uncured component 8 of the binder resin, and the surface is imparted with weak stickiness (tackiness). Accordingly, the heat conductive sheet 1 has improved conformity and adhesion to surfaces of the electronic element 3 and the heat spreader 2, which in turn results in a reduction in heat resistance.

Furthermore, since the surface of the sheet main body 7 of the heat conductive sheet 1 is coated with the uncured component 8 of the binder resin, and the surface of the heat conductive sheet 1 is imparted with weak stickiness, the heat conductive sheet 1 may be provisionally fixed to the main surface 2*a* of the heat spreader 2 or the upper surface 3*a* of the electronic element 3. Thus, the heat conductive sheet 1 omits the need for using an additional adhesive agent and accordingly, simplifies manufacturing processes and reduces cost.

Even when the weak stickiness of the surface of the heat conductive sheet 1 is lost during handling, standing for a predetermined time period allows the uncured component 8 of the binder resin to ooze from the sheet main body 7 again to coat the surface. Accordingly, even when adhered to the heat spreader 2 at a wrong position or provisionally fixed to the electronic element 3 at a wrong position, the heat conductive sheet 1 may be repaired.

Furthermore, in the heat conductive sheet 1, the uncured component 8 of the binder resin oozes from the entire surface of the sheet main body 7 to coat not only front and back surfaces but also side surfaces of the sheet main body 7. The uncured component 8 of the binder resin has insulating properties, and the heat conductive sheet 1 is imparted on side surfaces thereof with insulating properties. Accordingly, even when the heat conductive sheet 1 sandwiched between the electronic element 3 and the heat spreader 2 bulges to the periphery and come into contact with a conductive member disposed on the periphery, short circuit between the semiconductor device or the heat sink and the conductive member is prevented by way of the heat conductive sheet 1.

Additionally, after the cutting into the molded product sheet, the heat conductive sheet 1 may be pressed in the thickness direction into a predetermined thickness. The heat conductive sheet 1 is compressed in the thickness direction by pressing, and consequently, the fibrous fillers contact with each other more frequently. This reduces heat resistance of the heat conductive sheet 1. Furthermore, the surface of the heat conductive sheet 1 is smoothened by pressing.

Pressing force is preferably in the range of 0.0098 to 9.8 MPa and more preferably in the range of 0.049 to 9.3 MPa; when pressing force is too low, heat resistance tends to remain unchanged from that of an unpressed sheet, and when pressing force is too high, the sheet tends to be stretched.

Figure 2:
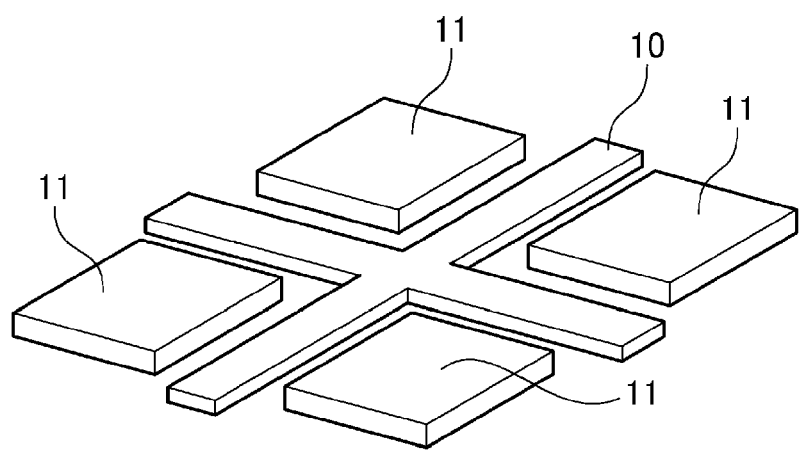
FIG. 2 is a perspective view of a state where a molded product sheet is pressed via a spacer.

As illustrated in FIG. 2, the molded product sheet 11 may be pressed with a spacer 10 resting on a surface opposing a press head, and thus, the heat conductive sheet 1 having a predetermined sheet thickness corresponding to the height of the spacer 10 is achieved.

As a result of the standing for a predetermined time period, in the heat conductive sheet 1, the uncured component 8 of the binder resin included in the sheet main body 7 oozes out until the uncured component 8 coats the entire surface of the sheet. The standing time period may be set long enough to allow the uncured component 8 of the binder resin to ooze out to coat the entire surface of the sheet main body 7 as appropriate in accordance with the compounding ratio between the binder resin component and the curing agent component included in the binder resin, an ambient temperature, an area of the sheet, and so forth.

To promote the oozing of the uncured component 8 of the binder resin and the effect of coating the surface of the sheet main body 7, the standing may be conducted in a high temperature environment. However, the standing may also be conducted in a low temperature environment to achieve weak stickiness over a long time period in consideration of time remaining before the heat conductive sheet 1 is actually used.

Figure 3:
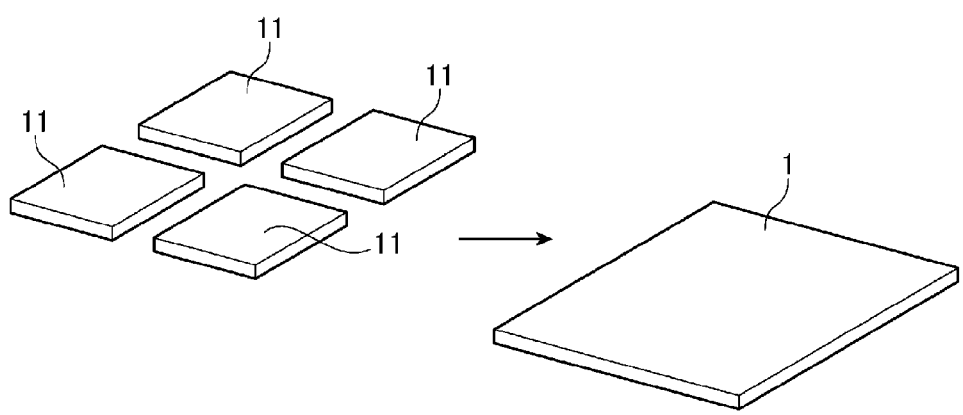
FIG. 3 is a perspective view illustrating a process of obtaining a large-sized heat conductive sheet by disposing a plurality of molded product sheets adjacent to each other and pressing the molded product sheets together.

Furthermore, as illustrated in FIG. 3, a plurality of (for example, 4 pieces of) molded product sheets 11 may be disposed adjacently and heat pressed together by a press head 12 without using the spacer 10. By doing so, the large-sized heat conductive sheet 1 in which the molded product sheets 11 are integrated is manufactured. In this case, the molded product sheets 11 each have a substantially rectangular shape having the same dimension and thickness and are preferably disposed adjacent to each other at an equal interval with one side of a molded product sheet 11 aligned with one side of the adjacent molded product sheet 11. In this way, the seamless and flat heat conductive sheet 1 having a uniform thickness is manufactured. In the large-sized heat conductive sheet 1 in which the molded product sheets 11 are integrated, the entire surface of the sheet main body 7 is coated with the uncured component of the binder resin oozing out as a result of standing for a predetermined time period after pressing.

EXAMPLES

First Examples

The following describes the first examples (Examples 1 to 7) and the first comparative examples (Comparative Examples 1 to 3). For the first examples and the first comparative examples, heat conductive sheet samples were prepared by varying the compounding ratio between the binder component and the curing agent component included in the heat conductive resin composition. For each sample, peel force (N/cm) of a PET film and heat resistance (K·cm²/W) were measured and evaluated, and workability in cutting into sheets, peeling from the release film, and adhesion.

Example 1

A silicone resin composition (heat conductive resin composition) of Example 1 was prepared by dispersing, in a two-part liquid silicone resin of addition reaction type, 20 vol % of alumina particles (as heat conductive particles manufactured by Denki Kagaku Kogyo Kabushiki Kaisha) having an average particle diameter of 4 μm and treated with a silane coupling agent, and 22 vol % of pitch-based carbon fibers (as heat conductive fibers manufactured by Nippon Graphite Fiber Co., Ltd.) having an average fiber length of 150 μm and an average fiber diameter of 9 μm, and 24 vol % of aluminum nitride (as heat conductive particles manufactured by Tokuyama Corporation) having an average particle diameter of 1 μm and treated with a silane coupling agent. The two-part liquid silicone resin of addition reaction type included 50 mass % of a silicone A liquid and 50 mass % of a silicone B liquid mixed together. The prepared silicone resin composition was extruded into a cuboid mold (20 mm×20 mm) having an inner wall applied with a PET film treated with a release coating to mold a silicone molded product. The obtained silicone molded product was cured in an oven for 6 hours at 100° C. to form a silicone cured product. The formed silicone cured product was heated in an oven for 1 hour at 100° C. and subsequently, cut by an ultrasonic cutter to obtain a molded product sheet having a thickness of 2.05 mm. A slicing rate of the ultrasonic cutter was 50 mm per second. Supersonic vibration applied to the ultrasonic cutter had an oscillation frequency of 20.5 kHz and an amplitude of 60 μm.

The obtained molded product sheet was sandwiched between PET films treated with a release coating and subsequently, was left standing for 10 hours at a room temperature, and thus, the heat conductive sheet sample was prepared.

Example 2

A heat conductive sheet sample of Example 2 was prepared under the same conditions as those of Example 1, except for that the two-part liquid silicone resin of addition reaction type included 52.5 mass % of the silicone A liquid and 47.5 mass % of the silicone B liquid mixed together.

Example 3

A heat conductive sheet sample of Example 3 was prepared under the same conditions as those of Example 1, except for that the two-part liquid silicone resin of addition reaction type included 55 mass % of the silicone A liquid and 45 mass % of the silicone B liquid mixed together.

Example 4

A heat conductive sheet sample of Example 4 was prepared under the same conditions as those of Example 1, except for that the two-part liquid silicone resin of addition reaction type included 56 mass % of the silicone A liquid and 44 mass % of the silicone B liquid mixed together.

Example 5

A heat conductive sheet sample of Example 5 was prepared under the same conditions as those of Example 1, except for that the two-part liquid silicone resin of addition reaction type included 57 mass % of the silicone A liquid and 43 mass % of the silicone B liquid mixed together.

Example 6

A heat conductive sheet sample of Example 6 was prepared under the same conditions as those of Example 1, except for that the two-part liquid silicone resin of addition reaction type included 60 mass % of the silicone A liquid and 40 mass % of the silicone B liquid mixed together.

Example 7

A heat conductive sheet sample of Example 7 was prepared under the same conditions as those of Example 1, except for that the two-part liquid silicone resin of addition reaction type included 65 mass % of the silicone A liquid and 35 mass % of the silicone B liquid mixed together.

First Comparative Examples

Comparative Example 1

A heat conductive sheet sample of Comparative Example 1 was prepared under the same conditions as those of Example 1, except for that the two-part liquid silicone resin of addition reaction type included 45 mass % of the silicone A liquid and 55 mass % of the silicone B liquid mixed together.

Comparative Example 2

A heat conductive sheet sample of Comparative Example 2 was prepared under the same conditions as those of Example 1, except for that the two-part liquid silicone resin of addition reaction type included 70 mass % of the silicone A liquid and 30 mass % of the silicone B liquid mixed together.

Comparative Example 3

A heat conductive sheet sample of Comparative Example 3 was prepared under the same conditions as those of Example 1, except for that the two-part liquid silicone resin of addition reaction type included 75 mass % of the silicone A liquid and 25 mass % of the silicone B liquid mixed together.

[Measurement of Peel Force]

The heat conductive sheet samples of Examples 1 to 7 and Comparative Examples 1 to 3 were peeled from the PET film treated with a release coating and then sandwiched by PET untreated with a release coating. Subsequently, each heat conductive sheet sample was pressed via a spacer having a thickness of 1.95 mm for 3 minutes at 80° C. and 2.45 MPa and cooled to a normal temperature. After that, an end of the PET film was peeled by hand and clamped by a testing machine and then, the PET film was pulled upward at an angle of 90° at a rate of 50 mm/min to measure load. Thus, weak stickiness (tackiness) of each heat conductive sheet sample was evaluated. The peel force (load) of each sample was measured with a predetermined tolerance. As for evaluation criteria, the peel force was evaluated as optimal when the peel force oscillated in the range of 0.05 to 0.25 (N/cm), as good when the peel force oscillated in the range of 0.02 to 0.05 (N/cm) and 0.20 to 0.30 (N/cm), and as fair when the peel force oscillated in the range of 0 to 0.04 (N/cm).

[Measurement of Heat Resistance]

The heat resistance of each of the heat conductive sheet samples of Examples 1 to 7 and Comparative Examples 1 to 3 was also measured by a method in compliance with ASTM-D5470 within a range of load of 0.3 kgf/cm$^2$. As for evaluation criteria, the heat resistance was evaluated as optimal when the heat resistance does not exceed approximately 1.3 (K·cm$^2$/W), as good when the heat resistance is in the range of 1.3 to 1.5 (K·cm$^2$/W), as fair when the heat resistance is in the range of 1.5 to 1.55 (K·cm$^2$/W), and as poor when the heat resistance is 1.55 (K·cm$^2$/W) or more.

Workability in cutting into sheets, peeling from the release film, and adhesion of each of the heat conductive sheet samples of Examples 1 to 7 and Comparative Examples 1 to 3 was also evaluated. As for evaluation criteria, workability was evaluated as good when a molded product sheet having a thickness of 2 mm was cut out of the silicone cured product by using an ultrasonic cutter, the sheet main body was not deformed at the time of peeling the PET film from the heat conductive sheet sample, and adhesion was performed with a predetermined degree of tackiness, and workability was evaluated as poor when the cutting, peeling, and adhesion operations were not performed smoothly.

TABLE 1

|  | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|
| Silicone A [%] | 50 | 52.5 | 55 | 56 | 57 | 60 | 65 | 25 | 30 | 70 |
| Silicone B [%] | 50 | 47.5 | 45 | 54 | 43 | 40 | 35 | 75 | 70 | 30 |
| PET peel force [N/cm] | 0 to 0.04 | 0 to 0.04 | 0.02 to 0.05 | 0.02 to 0.05 | 0.05 to 0.10 | 0.05 to 0.10 | 0.10 to 0.15 | 0 | 0 | 0.15 to 0.25 |
| Weak stickiness | Fair | Fair | Good | Good | Optimal | Optimal | Optimal | Poor | Poor | Good |
| Viscosity before curing [N/cm$^2$] | 15 to 25 | 15 to 25 | 10 to 20 | 10 to 20 | 10 to 20 | 10 to 20 | 5 to 15 | 35 to 45 | 30 to 40 | 5 to 15 |
| Heat resistance [K·cm$^2$/W] | 1.547 | 1.356 | 1.281 | 1.087 | 0.956 | 1.052 | 1.123 | 1.581 | 1.243 | 1.532 |
| Heat resistance | Fair | Good | Optimal | Optimal | Optimal | Optimal | Optimal | Poor | Optimal | Fair |
| Workability | Good | Good | Good | Good | Good | Good | Good | Poor | Poor | Poor |

As illustrated in Table 1, regarding the heat conductive sheet samples of Examples 1 to 7, the peeling force (N/cm) of the PET film oscillated in the range of 0 to 0.04 (Examples 1 and 2), in the range of 0.02 to 0.05 (Examples 3 and 4), in the range of 0.05 to 0.10 (Examples 5 and 6), and in the range of 0.10 to 0.15 (Example 7), and it can be seen that appropriate weak stickiness (tackiness) is imparted. In this regard, the peeling force of Example 1 encompasses 0

(N/cm) because the value obtained when the PET film starts to peel is measured to be lower than an actual peeling force.

Thus, in each of the heat conductive sheet samples of Examples 1 to 7, the uncured component of the silicone liquid oozed out of the entire surface of the sheet to coat the entire surface, and thereby appropriate stickiness is imparted. Accordingly, the heat conductive sheet samples of Examples 1 to 7 had improved conformity and adhesion to surfaces of objects to which the conductive sheet samples were to be adhered and therefore, reduced heat resistance.

Since the surfaces of the heat conductive sheet samples of Examples 1 to 7 are each coated with the uncured component of the binder resin, and the surface of the heat conductive sheet sample is imparted with weak stickiness, the heat conductive sheet sample may be provisionally fixed. This omits the need for using an additional adhesive agent and accordingly, simplifies manufacturing processes and reduces cost.

In contrast, regarding the heat conductive sheet sample of Comparative Example 1, in which the compounding ratio of the silicone A liquid was as low as 45%, the uncured component did not remain sufficiently, and even after standing, the entire surface was not coated with the uncured component, and weak stickiness was not imparted in a portion of the heat conductive sheet sample. Accordingly, the heat conductive sheet sample of Comparative Example 1, in the portion thereof in which weak stickiness is not observed, cannot be fixed provisionally to an object to which the conductive sheet sample is to be adhered and therefore, workability is poor. Furthermore, the heat conductive sheet sample of Comparative Example 1 lacked flexibility and included the carbon fibers exposed to the surface, and therefore, had poor conformity and adhesion to surfaces of objects to which the heat conductive sheet sample is to be adhered. As a result, the heat resistance was increased.

Regarding each of the heat conductive sheet samples of Comparative Examples 2 and 3, in which the compounding ratio of the silicone A liquid was as high as 70% or more, the sheet main body was not hard enough to maintain the shape. When the PET film was attempted to be peeled, the sheet shape cannot be maintained, and handling is difficult. Furthermore, the heat conductive sheet sample of Comparative Example 3 lacked hardness of the silicone cured product, and the process of cutting into thin sheets was difficult.

Second Examples

The following describes the second examples. For the second examples, a relation between a standing time period and peel force (N/cm) was studied on the molded product sheet cut out of the silicone cured product into a thickness of 2 mm by using an ultrasonic cutter.

Heat conductive sheet samples of the second examples were prepared by the same processes as those in Example 5. A silicone resin composition (heat conductive resin composition) was prepared by dispersing, in a two-part liquid silicone resin of addition reaction type, 20 vol % of alumina particles (as heat conductive particles manufactured by Denki Kagaku Kogyo Kabushiki Kaisha) having an average particle diameter of 4 μm and treated with a silane coupling agent, and 22 vol % of pitch-based carbon fibers (as heat conductive fibers manufactured by Nippon Graphite Fiber Co., Ltd.) having an average fiber length of 150 μm and an average fiber diameter of 9 μm, and 24 vol % of aluminum nitride (as heat conductive particles manufactured by Tokuyama Corporation) having an average particle diameter of 1 μm and treated with a silane coupling agent. The two-part liquid silicone resin of addition reaction type included 57 mass % of the silicone A liquid and 43 mass % of the silicone B liquid mixed together. The prepared silicone resin composition was extruded into a cuboid mold (20 mm×20 mm) having an inner wall applied with a PET film treated with a release coating to mold a silicone molded product. The obtained silicone molded product was cured in an oven for 6 hours at 100° C. to form a silicone cured product. The formed silicone cured product was heated in an oven for 1 hour at 100° C. and subsequently, cut by an ultrasonic cutter to obtain a molded product sheet having a thickness of 2.05 mm. The slicing rate of the ultrasonic cutter was 50 mm per second. Supersonic vibration applied to the ultrasonic cutter had an oscillation frequency of 20.5 kHz and an amplitude of 60 μm.

The obtained molded product sheet was sandwiched between PET films treated with a release coating and then, immediately after cutting, was left standing for 5 minutes, 10 minutes, 20 minutes, 30 minutes, 60 minutes, 300 minutes, 720 minutes (12 hours), and 1440 minutes (24 hours) at a room temperature, and thus, each heat conductive sheet sample was prepared.

The heat conductive sheet samples were peeled from the PET film treated with a release coating and then sandwiched by PET untreated with a release coating. Subsequently, each heat conductive sheet sample was pressed via a spacer having a thickness of 1.95 mm for 3 minutes at 80° C. and 2.45 MPa and cooled to a normal temperature. After that, an end of the PET film was peeled by hand and clamped by a testing machine and then, the PET film was pulled upward at an angle of 90° at a rate of 50 mm/min to measure load (N/cm). The peel force (load) of each sample was measured with a predetermined tolerance.

Besides, the molded product sheets were punched to a finished product size, and the cut surface and the punched side surface were observed 5 minutes, 20 minutes, and 30 minutes after cutting.

TABLE 2

| | Amount of time elapsed after cutting (minutes) | | | | | | | | |
|---|---|---|---|---|---|---|---|---|---|
| | 0 | 5 | 10 | 20 | 30 | 60 | 300 | 720 | 1440 |
| PET peel force (N/cm) | 0 | 0.03 to 0.09 | 0.10 to 0.20 | 0.20 to 0.30 | 0.31 to 0.37 | 0.31 to 0.37 | 0.31 to 0.37 | 0.31 to 0.37 | 0.31 to 0.37 |

Figure 4:
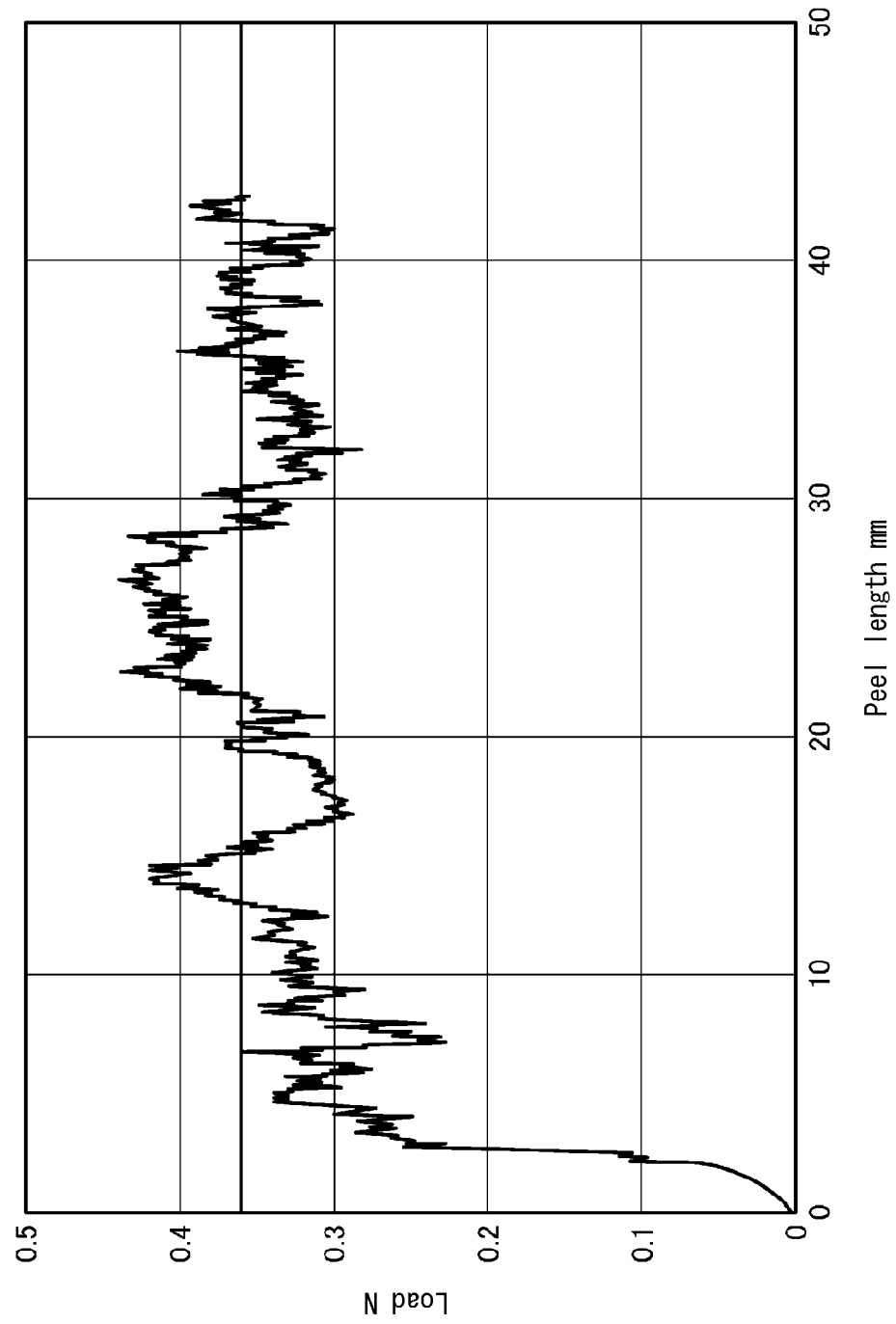
FIG. 4 is a graph illustrating results of measurement of peel force according to Example.
Figure 5A:
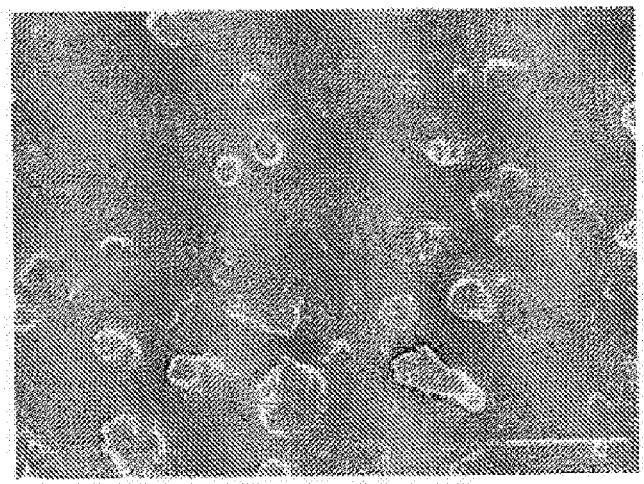
FIG. 5A is an SEM image of a surface of a sheet taken 5 minutes after cutting and taken from the front of the cut surface.
Figure 5B:
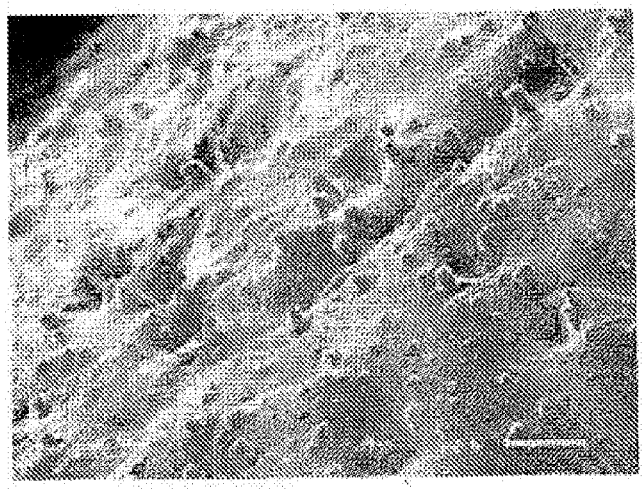
FIG. 5B is an SEM image of a surface of a sheet taken 5 minutes after cutting and taken obliquely to the cut surface.
Figure 5C:
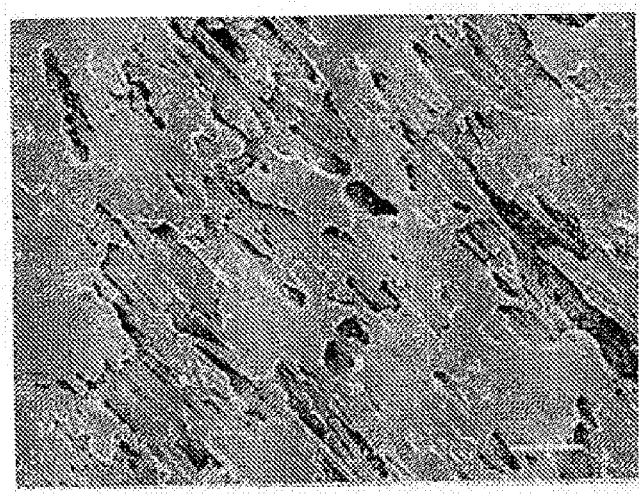
FIG. 5C is an SEM image of a side surface of a sheet punched to a finished product size after 5 minutes from cutting.
Figure 6A:
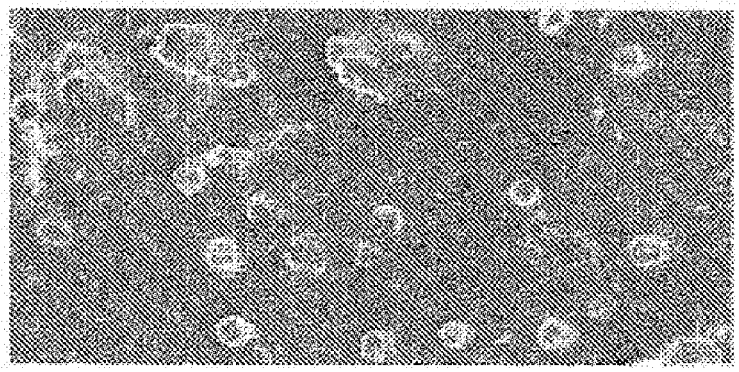
FIG. 6A is an SEM image of a surface of a sheet taken 20 minutes after cutting and taken from the front of the cut surface.
Figure 6B:
FIG. 6B is an SEM image of a surface of a sheet taken 20 minutes after cutting and taken obliquely to the cut surface.
Figure 6C:
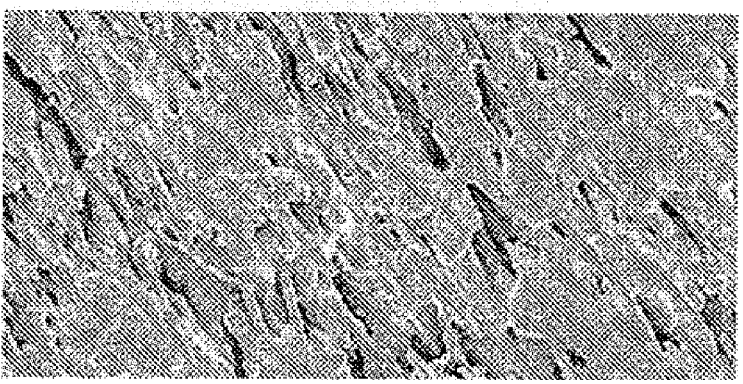
FIG. 6C is an SEM image of a side surface of a sheet punched to a finished product size after 20 minutes from cutting.
Figure 7A:
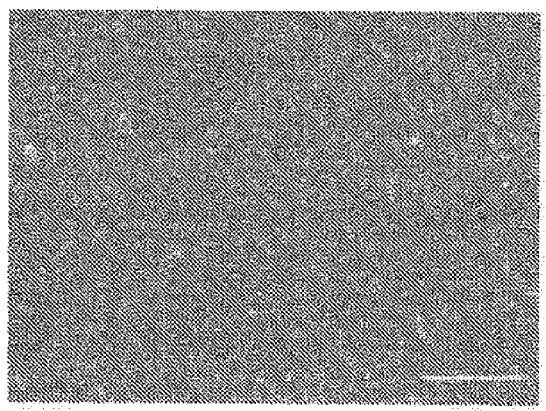
FIG. 7A is an SEM image of a surface of a sheet taken 30 minutes after cutting and taken from the front of the cut surface.
Figure 7B:
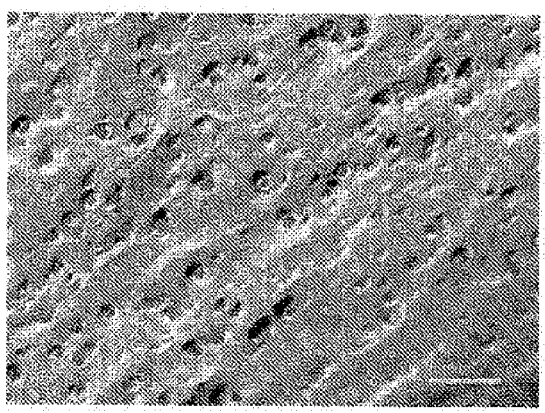
FIG. 7B is an SEM image of a surface of a sheet taken 30 minutes after cutting and taken obliquely to the cut surface.
Figure 7C:
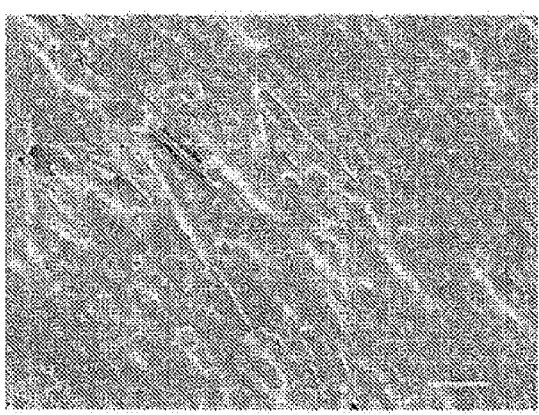
FIG. 7C is an SEM image of a side surface of a sheet punched to a finished product size after 30 minutes from cutting.

Table 2 shows results of the measurement. FIG. 4 illustrates results of the measurement of peel force of the heat conductive sheet sample that has been left standing for 30 minutes after cutting. FIGS. 5A and 5B illustrate SEM images of the heat conductive sheet sample that has been left standing for 5 minutes after cutting as taken from the front (FIG. 5A) of and obliquely (FIG. 5B) to the cut surface, and FIG. 5C illustrates an SEM image of a side surface of the same heat conductive sheet sample that has been punched to a finished product size. Similarly, FIGS. 6A and 6B illustrate SEM images of the heat conductive sheet sample that has been left standing for 20 minutes after cutting as taken from the front (FIG. 6A) of and obliquely (FIG. 6B) to the cut surface, and FIG. 6C illustrates an SEM image of a side surface of the same heat conductive sheet sample that has been punched to a finished product size. Furthermore, FIGS. 7A and 7B illustrate SEM images of the heat conductive sheet sample that has been left standing for 30 minutes after cutting as taken from the front (FIG. 7A) of and obliquely (FIG. 7B) to the cut surface, and FIG. 7C illustrates an SEM image of a side surface of the same heat conductive sheet sample that has been punched to a finished product size.

As illustrated in Table 2, the peel force of the heat conductive sheet sample increases in proportion to the amount of time elapsed after cutting. The reason is that the uncured component of the binder resin oozes from the sheet main body to gradually coat the entire surface of the sheet main body. As can be seen from FIGS. 5A to 5C, the carbon fibers are exposed when 5 minutes have elapsed since cutting. As illustrated in FIGS. 6A to 6C, when 20 minutes have elapsed since cutting, the uncured component of the binder resin has oozed out to coat the sheet surface and the carbon fibers. As can be seen from FIGS. 7A to 7C, when 30 minutes have elapsed since cutting, the sheet surface has been roughly coated with the uncured component of the binder resin, and the carbon fibers have been completely sunk in the sheet main body.

The peel force of the heat conductive sheet sample remains unchanged after 30 minutes have elapsed since cutting. The reason is that the uncured component of the binder resin stops oozing out once coating the entire surface of the sheet main body.

Figure 8:
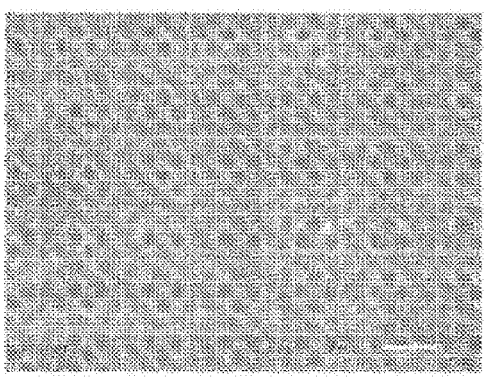
FIG. 8 is an SEM image of a surface of a sheet taken 60 minutes after cutting and taken from the front of the cut surface.

Thus, the heat conductive sheet is acknowledged to be imparted with weak stickiness by left standing for a predetermined time period after the cutting of the molded product sheet into sheets. FIG. 8 is an SEM image of the surface of the sheet taken 60 minutes after cutting and taken from the front of the cut surface. It can be seen that the sheet surface is coated with the uncured component of the binder resin and that the carbon fibers are completely sunk in the sheet main body to provide a smoothened sheet surface. The standing time period and the weak stickiness to be imparted may be adjusted in accordance with the compounding ratio between the binder resin component and the curing agent component included in the heat conductive resin composition.

As illustrated in FIG. 4, peel force (N/cm) increases sharply immediately after peeling and oscillates up and down once the peel length reaches approximately 10 mm. With reference to values of peel force obtained at and after the peeling length of 10 mm, an average value 0.36 N/cm is obtained as a proper peeling force of the heat conductive sheet sample that has been left standing for 30 minutes after cutting.

Third Examples

The following describes the third examples (Examples 8 to 14) and the second comparative examples (Comparative Examples 4 to 6). For the third examples and the second comparative examples, heat conductive sheet samples were prepared by varying the compounding ratio between the binder component and the curing agent component included in the heat conductive resin composition similarly to the first examples. For each sample, changes in compression stress and residual stress over time and the content of the uncured component in the heat conductive resin composition were measured.

Example 8

A silicone resin composition of Example 8 was prepared by dispersing, in a two-part liquid silicone resin of addition reaction type, 20 vol % of alumina particles (as heat conductive particles manufactured by Denki Kagaku Kogyo Kabushiki Kaisha) having an average particle diameter of 4 μm and treated with a silane coupling agent, and 22 vol % of pitch-based carbon fibers (as heat conductive particles manufactured by Nippon Graphite Fiber Co., Ltd.) having an average fiber length of 150 μm and an average fiber diameter of 9 μm, and 24 vol % of aluminum nitride (as heat conductive particles manufactured by Tokuyama Corporation) having an average particle diameter of 1 μm and treated with a silane coupling agent. The two-part liquid silicone resin of addition reaction type included 35 mass % of the silicone A liquid and 65 mass % of the silicone B liquid mixed together. The prepared silicone resin composition was extruded into a cuboid mold (50 mm×50 mm) having an inner wall applied with a PET film treated with a release coating to mold a silicone molded product. The obtained silicone molded product was cured in an oven for 6 hours at 100° C. to form a silicone cured product. The formed silicone cured product was heated in an oven for 1 hour at 100° C. and subsequently, cut by an ultrasonic cutter to obtain a molded product sheet having a thickness of 2.05 mm. The slicing rate of the ultrasonic cutter was 50 mm per second. Supersonic vibration applied to the ultrasonic cutter had an oscillation frequency of 20.5 kHz and an amplitude of 60 μm.

The obtained molded product sheet was further cut into 25 mm×25 mm pieces and subsequently, sandwiched between PET films (having a thickness of 38 μm) and then, immediately after cutting, left standing for 1 day and 10 days at a room temperature, and thus, each heat conductive sheet sample was prepared. The content of the uncured component in the molded product sheet was 1.0%.

Example 9

A heat conductive sheet sample of Example 9 was prepared under the same conditions as those of Example 8, except for that the two-part liquid silicone resin of addition reaction type included 52.5 mass % of the silicone A liquid and 47.5 mass % of the silicone B liquid mixed together. The content of the uncured component in the molded product sheet was 1.9%.

Example 10

A heat conductive sheet sample of Example 10 was prepared under the same conditions as those of Example 8, except for that the two-part liquid silicone resin of addition reaction type included 55 mass % of the silicone A liquid and 45 mass % of the silicone B liquid mixed together. The content of the uncured component in the molded product sheet was 2.8%.

Example 11

A heat conductive sheet sample of Example 11 was prepared under the same conditions as those of Example 8, except for that the two-part liquid silicone resin of addition reaction type included 56 mass % of the silicone A liquid and 44 mass % of the silicone B liquid mixed together. The content of the uncured component in the molded product sheet was 3.6%.

Example 12

A heat conductive sheet sample of Example 12 was prepared under the same conditions as those of Example 8, except for that the two-part liquid silicone resin of addition reaction type included 57 mass % of the silicone A liquid and 43 mass % of the silicone B liquid mixed together. The content of the uncured component in the molded product sheet was 4.0%.

Example 13

A heat conductive sheet sample of Example 13 was prepared under the same conditions as those of Example 1, except for that the two-part liquid silicone resin of addition reaction type included 60 mass % of the silicone A liquid and 40 mass % of the silicone B liquid mixed together. The content of the uncured component in the molded product sheet was 4.4%.

Example 14

A heat conductive sheet sample of Example 14 was prepared under the same conditions as those of Example 1, except for that the two-part liquid silicone resin of addition reaction type included 65 mass % of the silicone A liquid and 35 mass % of the silicone B liquid mixed together. The content of the uncured component in the molded product sheet was 5.0%.

Second Comparative Examples

Comparative Example 4

A heat conductive sheet sample of Comparative Example 4 was prepared under the same conditions as those of Example 8, except for that the two-part liquid silicone resin of addition reaction type included 45 mass % of the silicone A liquid and 55 mass % of the silicone B liquid mixed together. The content of the uncured component in the molded product sheet was 0.8%.

Comparative Example 5

A heat conductive sheet sample of Comparative Example 5 was prepared under the same conditions as those of Example 8, except for that the two-part liquid silicone resin of addition reaction type included 70 mass % of the silicone A liquid and 30 mass % of the silicone B liquid mixed together. The content of the uncured component in the molded product sheet was 5.5%.

Comparative Example 6

A heat conductive sheet sample of Comparative Example 6 was prepared under the same conditions as those of Example 8, except for that the two-part liquid silicone resin of addition reaction type included 75 mass % of the silicone A liquid and 25 mass % of the silicone B liquid mixed together. The content of the uncured component in the molded product sheet was 6.0%.

[Measurement of Maximum Compression Stress]

By using a tensile and compression testing machine (Tensilon RTG-1225 manufactured by A & D Company, Limited), the maximum compression stress of each heat conductive sheet sample when compressed 40% at a compression rate of 25.4 mm/min was measured.

[Measurement of Residual Stress]

The heat conductive sheet samples whose maximum compression stresses were measured were retained with the 40% compression by the tensile and compression testing machine for 10 minutes, and compression stresses were measured when 10 minutes elapsed.

[Content of Uncured Component]

The heat conductive sheets immediately after cutting were punched into 20 mmΦ pieces, and the masses of the samples were measured. Subsequently, a piece of filter paper (No. 1 manufactured by Advantec Toyo Co., Ltd.) was disposed over and under each sample, and the sample was left standing in an oven at a temperature of 125° C. for 24 hours with a 9.42 kg weight placed thereon to let the uncured component adsorb to the filter paper. After the sample was moved back to a room temperature, the filter paper was removed, and the content of the uncured component was obtained by calculating a rate of change in mass by measuring the mass of the heat conductive sheet.

TABLE 3

|  | Example 8 | Example 9 | Example 10 | Example 11 | Example 12 | Example 13 | Example 14 | Comparative Example 4 | Comparative Example 5 | Comparative Example 6 |
|---|---|---|---|---|---|---|---|---|---|---|
| Silicone A [%] | 50 | 52.5 | 55 | 56 | 57 | 60 | 65 | 45 | 70 | 75 |
| Silicone B [%] | 50 | 47.5 | 45 | 44 | 43 | 40 | 35 | 55 | 30 | 25 |
| Maximum compression stress [N] of heat conductive sheet immediately after cutting | 1000 | 990 | 950 | 950 | 850 | 800 | 700 | 1300 | 660 | 600 |
| Residual stress [N] of heat conductive sheet immediately after cutting | 200 | 190 | 160 | 150 | 140 | 130 | 120 | 240 | 100 | 90 |
| Maximum compression stress [N] of heat conductive sheet 1 day after cutting | 990 | 985 | 930 | 920 | 820 | 770 | 680 | 1290 | 620 | 560 |

TABLE 3-continued

| | Example 8 | Example 9 | Example 10 | Example 11 | Example 12 | Example 13 | Example 14 | Comparative Example 4 | Comparative Example 5 | Comparative Example 6 |
|---|---|---|---|---|---|---|---|---|---|---|
| Residual stress [N] of heat conductive sheet 1 day after cutting | 200 | 190 | 158 | 147 | 135 | 126 | 115 | 238 | 90 | 80 |
| Maximum compression stress [N] of heat conductive sheet 10 days after cutting | 860 | 800 | 775 | 720 | 630 | 600 | 580 | 1050 | 510 | 480 |
| Residual stress [N] of heat conductive sheet 10 days after cutting | 195 | 185 | 155 | 145 | 135 | 125 | 110 | 235 | 90 | 80 |
| Content [%] of uncured component | 1.0 | 1.9 | 2.8 | 3.6 | 4.0 | 4.4 | 5.0 | 0.8 | 5.5 | 6.0 |

As illustrated in Table 3, in the heat conductive sheet samples of Examples 8 to 14, the contents of the uncured component were in the range between 1% and 5%. Although too much content of the uncured component might lead to a contact surface between a heat source or a heat dissipater and the sheet being smeared with oil, the uncured component in the range between 1% and 5% will not be an obstacle for use as the heat conductive sheet. Too little content of the uncured component might lead to an increase in heat resistance due to contact failure with the heat source and the dissipater, and therefore, the content of the uncured component is preferably in the range of Examples 8 to 14.

As illustrated in Table 3, it has been confirmed that the maximum compression stresses of the heat conductive sheet samples of Examples 8 to 14 measured 1 day and 10 days after slicing are smaller than those measured immediately after slicing. Excessive maximum compression stress and residual stress mean that a greater load is applied to the board during mounting. With the uncured component in the aforementioned range, preferable values of the maximum compression stresses and the residual stresses are achieved as illustrated in Table 3.

On the other hand, in the heat conductive sheet sample of Comparative Example 4, the content of the uncured component was less than 1%. Since the content of the uncured component in the heat conductive sheet sample of Comparative Example 4 is less than those of Examples 8 to 14, the heat conductive sheet sample of Comparative Example 4 poses a risk that heat resistance might increase due to contact failure with the heat source and the heat dissipater. Furthermore, since the maximum compression stress and the residual stress of the heat conductive sheet sample of Comparative Example 4 is greater than those of Examples 8 to 14, a greater load is applied to the board.

In each of the heat conductive sheet samples of Comparative Examples 5 and 6, the content of the uncured component was more than 5%. Since the content of the uncured component in the heat conductive sheet samples of Comparative Examples 5 and 6 is greater than those of Examples 8 to 14, there is a risk that the contact surface between the heat source or the heat dissipater and the sheet might be smeared with oil.

REFERENCE SIGNS LIST 1 heat conductive sheet
2 heat spreader
2a main surface
3 electronic element
3a upper surface
4 heat dissipation member
5 heat sink
6 circuit board
10 spacer

The invention claimed is:

1. A method of manufacturing a heat conductive sheet, comprising the steps of:
    molding a heat conductive resin composition, which includes heat conductive fillers and a binder resin, into a predetermined shape and curing the heat conductive resin composition to obtain a molded product of the heat conductive resin composition which is a cuboid having a cross section with a vertical dimension of 0.5 to 15 cm and a horizontal dimension of 0.5 to 15 cm;
    cutting the molded product into sheets to obtain at least one molded product sheet; and
    leaving the molded product sheet standing for 30 minutes or longer to coat an entire surface of the sheet main body with an uncured component of the binder resin oozing from the sheet main body.

2. The method of manufacturing a heat conductive sheet according to claim 1, wherein
    the binder resin includes liquid silicone gel as a main ingredient and a curing agent, and a compounding ratio of the curing agent to the main ingredient is as follows:
    Main ingredient:curing agent=50:50 to 65:35.

3. The method of manufacturing a heat conductive sheet according to claim 1, wherein
    the heat conductive fillers comprise carbon fibers, and
    the heat conductive resin composition is extruded and filled into a hollow die, and the heat conductive resin composition is heat cured, to obtain the molded product in which the carbon fibers are orientated randomly with respect to a direction in which the heat conductive resin composition is extruded.

4. The method of manufacturing a heat conductive sheet according to claim 2, wherein
    the heat conductive fillers comprise carbon fibers, and
    the heat conductive resin composition is extruded and filled into a hollow die, and the heat conductive resin composition is heat cured, to obtain the molded product in which the carbon fibers are orientated randomly with respect to a direction in which the heat conductive resin composition is extruded.

5. The method of manufacturing a heat conductive sheet according to claim 1, wherein
    the at least one molded product sheet comprises a plurality of molded product sheets, and the molded product sheets are disposed adjacently and pressed together to manufacture the heat conductive sheet in which the molded product sheets are integrated.

6. The method of manufacturing a heat conductive sheet according to claim 2, wherein
the at least one molded product sheet comprises a plurality of molded product sheets, and the molded product sheets are disposed adjacently and pressed together to manufacture the heat conductive sheet in which the molded product sheets are integrated.

7. The method of manufacturing a heat conductive sheet according to claim 3, wherein
the at least one molded product sheet comprises a plurality of molded product sheets, and the molded product sheets are disposed adjacently and pressed together to manufacture the heat conductive sheet in which the molded product sheets are integrated.

8. The method of manufacturing a heat conductive sheet according to claim 4, wherein
the at least one molded product sheet comprises a plurality of molded product sheets, and the molded product sheets are disposed adjacently and pressed together to manufacture the heat conductive sheet in which the molded product sheets are integrated.

* * * * *